(12) United States Patent
Hultsch

(10) Patent No.: US 7,415,037 B1
(45) Date of Patent: Aug. 19, 2008

(54) METHOD AND APPARATUS FOR REAL-TIME TRANSMISSION OF COMPRESSED DATA

(75) Inventor: Wolfgang Hultsch, München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/700,626

(22) PCT Filed: May 7, 1999

(86) PCT No.: PCT/DE99/01392

§ 371 (c)(1),
(2), (4) Date: Nov. 17, 2000

(87) PCT Pub. No.: WO99/60708

PCT Pub. Date: Nov. 25, 1999

(30) Foreign Application Priority Data

May 20, 1998 (DE) ................................ 198 22 796

(51) Int. Cl.
*H04L 12/20* (2006.01)
(52) U.S. Cl. ...................................... 370/466; 370/476
(58) Field of Classification Search ................ 370/351, 370/352, 353, 354, 355, 356, 395.64, 528, 370/465–467, 468, 477, 474, 476, 400, 401
See application file for complete search history.

(56) References Cited

U.S. PATENT DOCUMENTS 5,251,313 A   10/1993   Spenik et al.
5,623,495 A * 4/1997   Eng et al. .................... 370/397
5,754,555 A * 5/1998   Hurme et al. ................ 370/522
6,128,322 A * 10/2000  Rasanen et al. ............. 370/536
6,151,332 A * 11/2000  Gorsuch et al. ............. 370/466

(Continued)

FOREIGN PATENT DOCUMENTS

WO    WO 96/18272    6/1996

OTHER PUBLICATIONS

XP 000620830—Network Based Virtual Visual Center (VVC) Development Schemes, Wunnava et al., pp. 687-692.

(Continued)

*Primary Examiner*—Wing F. Chan
*Assistant Examiner*—Duc T Duong
(74) *Attorney, Agent, or Firm*—Bell Boyd & Lloyd LLP

(57) ABSTRACT

A method and apparatus for real-time transmission of compressed data wherein, useful data and filling data are received as a data stream with a constant data rate via a circuit-switched connection of a first communication network, the filling data contained in the data stream with the constant data rate is removed, and the useful data contained in the data stream with the constant data rate is reformatted and sent as a data stream with a variable data rate via a packet-oriented connection of a second communications network. Efficient utilization of the transmission bandwidth is accomplished by the removal of the superfluous filling data which are received in the data stream with the constant data rate via the circuit-switched connection, and the reformatting of the useful data for the data stream with the variable data rate via the packet-oriented connection. This has a particularly favorable effect if the real-time transmission of the compressed data leads into a mobile communications network with a radio interface which is limited in terms of transmission bandwidth.

4 Claims, 1 Drawing Sheet

U.S. PATENT DOCUMENTS

| | | | |
|---|---|---|---|
| 6,157,635 A * | 12/2000 | Wang et al. | 370/352 |
| 6,181,711 B1 * | 1/2001 | Zhang et al. | 370/468 |
| 6,456,629 B1 * | 9/2002 | Bjorkqvist et al. | 370/466 |
| 6,466,562 B1 * | 10/2002 | Yoshida et al. | 370/336 |
| 6,574,221 B1 * | 6/2003 | Petersen | 370/395.1 |
| 6,671,289 B1 * | 12/2003 | Tamura et al. | 370/474 |

OTHER PUBLICATIONS

XP-000723078—Mobile Computing Using Personal Handy-Phone System (PHS), Tanaka et al., pp. 1118-1124.

* cited by examiner

METHOD AND APPARATUS FOR REAL-TIME TRANSMISSION OF COMPRESSED DATA

FIELD OF TECHNOLOGY

The present invention relates to both a method and an apparatus by which it is possible to obtain economic real-time transmission of compressed data from one communications network to another communications network.

BACKGROUND

The invention relates to a method and an arrangement for real-time transmission of compressed data.

The transmission of compressed data in the field of telecommunications is usually effected on line-connected connections. Thus, by way of example, video data is generated in the course of a video conference or during video telephony by ISDN terminals (Integrated Services Digital Network) and is transmitted in real time exclusively via circuit-switched connections of an ISDN fixed network with a constant data rate; i.e., on one or two 64 kbit/s paths. Depending on the motion of the objects in the recorded picture, the coding device responsible for the data compression generates data streams with greatly varying data rates. For transmission in the ISDN fixed network, the data streams—with the varying data rates—are brought to the respective constant data rate by the suitable addition of filling data (bit stuffing) to the compressed video data. Real-time transmission of the compressed data, that has been conditioned with filling data, into a communications network with data streams with a variable data rate (e.g., a mobile communications network with a radio interface), is uneconomical since the precious transmission bandwidth available on the radio interface must be utilized as efficiently as possible with regard to useful data transmission.

An object of the present invention is to employ a method and an apparatus by which it is possible to obtain economical real-time transmission of compressed data from one communications network to another communications network.

SUMMARY

Thus the present invention, useful data and filling data are received as a data stream with a constant data rate via a circuit-switched connection of a first communications network. The filling data contained in the data stream with the constant data rate is then removed, and the useful data contained in the data stream with the constant data rate is reformatted and sent as a data stream with—a variable data rate via a packet-oriented connection of a second communications network. An advantage of the present invention lies in the efficient utilization of the transmission bandwidth by the removal of the superfluous filling data which is received in the data stream with the constant data rate via the circuit-switched connection, and the reformatting of the useful data for the data stream with the variable data rate via the packet-oriented connection. This has a particularly favorable effect if the real-time transmission of the compressed data leads into a mobile communications network with a radio interface which is limited in terms of transmission bandwidth. Instead of the sorted-out filling data, useful data is transmitted in accordance with the variable transmission bandwidth available for the subscriber connection; i.e., in data streams with higher data rates.

According to an embodiment of the present invention, quality data for identifying the transmission quality of the packet-oriented connection is communicated to the second communications network. The effect achieved as a result of this is that in the second communications network there is uniformly good transmission of the compressed data—exclusively useful data—in comparison with the transmission quality of the first communications network.

Preferably, an average data rate and/or a maximum data rate for the data stream with the variable data rate is determined as quality data. Setting the average data rate and/or the maximum data rate makes it possible to obtain an acceptable reproduction quality of the compressed useful data at the receiver since the real-time transmission allows for only very short delay times; e.g., in the milliseconds range.

In accordance with a further embodiment of the present invention, the quality factor of the transmission channel used for the data stream with the variable data rate—detectable from the permissible bit error rate—is used for identifying the transmission quality.

The present invention has proven to be particularly favorable with regard to economical and efficient utilization of radio resources if compressed video data is received as the data stream with the constant data rates via the circuit-switched connection of a line-connected communications network. Thereafter, the compressed video data is sent as the data stream with the variable data rate via the packet-oriented connection of a mobile communications network.

The apparatus in accordance with the present invention includes a receiving unit, a control unit and a sending unit. The receiving unit receives both useful data and filling data which arrive as a data stream with a constant data rate via a circuit-switched connection of a first communications network. The control unit removes the filling data contained in the data stream with the constant data rate and reformats the useful data contained in the data stream with the constant data rate. The sending unit sends the reformatted useful data as a data stream with a variable data rate via a packet-oriented connection of a second communications network.

Additional features and advantages of the present invention are described in, and will be apparent from, the following Brief Description of the Drawings and the Detailed Description.

DETAILED DESCRIPTION

Figure 1:
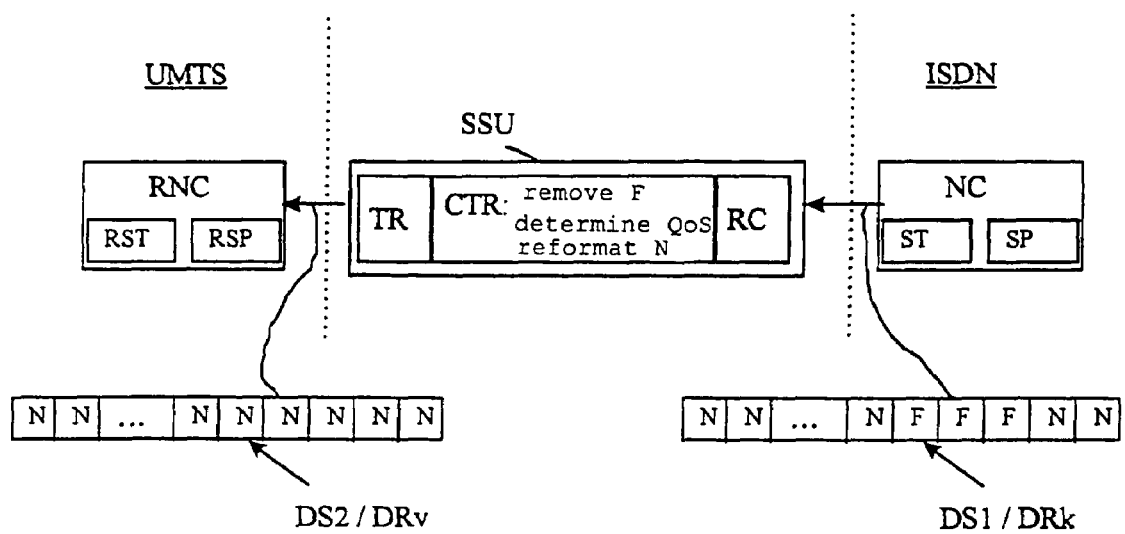
FIG. 1 shows a diagrammatic representation of the method and apparatus for real-time transmission of compressed data between a first communications network and a second communications network in accordance with the teachings of the present invention.

In the present example, it shall be assumed that the first communications network is formed by a fixed network ISDN (Integrated Services Digital Network) and the second communications network is formed by a mobile communications network UMTS (Universal Mobile Telecommunication System). Furthermore, it shall be assumed that a device SSU having the features of the present invention for real-time transmission of the compressed data from the fixed network ISDN to the mobile communications network UMTS is arranged as an autonomous device between the two communications networks. However, the present invention also considers that the SSU could also be part of either the fixed network ISDN or the mobile communications network UMTS. Furthermore, the present invention is not restricted to the exemplary communications networks ISDN, UMTS, but rather can be applied to other communications networks as well. The fixed network ISDN and the mobile communications network UMTS each have a control device NC and RNC, respectively, which, on the network side, forms the interface to the device SSU for the data transmission. If the device SSU is part of the fixed network ISDN or the mobile communications network UMTS, it would preferably be arranged in the control device NC or RNC, respectively. Each control device RNC, NC has both a control unit RST, ST and a storage unit RSP, SP. The device SSU likewise is provided with a control unit CTR to which there are connected a receiving unit RC at the interface to the control device NC and a sending unit TR at the interface to the control device RNC.

The compressed data is, by way of example, compressed video data which is generated by a video coder as a data stream DS1 with a constant data rate DRk—for example 64 kbit/s or 2*64 kbit/s—and is transmitted via at least one circuit-switched connection of the fixed network ISDN. In this case, the constant data rate DRk is generated by the addition of filling data F to useful data N (bit stuffing). The useful data N contains the data which is necessary for the video conference, is generated by a communications terminal of the line-connected fixed network ISDN and is transported in real time to a communications terminal of the mobile communications network UMTS. In order to enable efficient and economical utilization of the radio resources—in particular of the radio interface which is limited in terms of transmission bandwidth—during the real-time transmission of the compressed video data even in the mobile communications network UMTS, the device SSU converts the received data stream DS1 with the constant data rate DRk into a data stream DS2 with a variable data rate DRv. The receiving unit RC receives the filling data F and useful data N arriving via the circuit-switched connection. The control unit CTR detects and removes the filling data F from the data stream DS1 and reformats only the remaining useful data N to form a data stream DS2 with a variable data rate DRv. The sending unit TR sends only useful data N in the conditioned data stream DS2 with the variable data rate DRv via a packet-oriented connection of the mobile communications network UMTS. The reformatting is effected by embedding the useful data N (i.e., the video data-into the transmission format of, for example), a packet-oriented GPRS service (General Packet Radio Service) or of the packet-oriented ATM (Asynchronous Transfer Mode) cells. In this way, the data gap produced by the filling data F, in the data stream DS1 with the constant data rate DRk, can be utilized for the transmission of further video data or other useful data N in the data stream DS1 with the variable data rate DRv.

The control unit CTR of the device SSU determines quality data QoS (Quality of Service) for identifying the transmission quality of the packet-oriented connection and communicates them to the control device RNC of the mobile communications network UMTS via the sending unit TR. The effect achieved as a result of this is that in the second communications network UMTS uniformly good transmission of the compressed data, which is exclusively useful data N in the data stream DS2 with the variable data rate DRv, prevails in comparison with the transmission quality of the first communications network ISDN. The quality data QoS include, for example, the specification of the quality factor of the transmission channel used for the data stream DS2 in the mobile communications network UMTS, detectable from the permissible bit error rate. The real-time requirements made of the transmission of the video data by a package-oriented method in the mobile communications network UMTS are reflected in an average data rate and/or a maximum data rate which are determined as quality data QoS for the data stream with the variable data rate. Setting the average data rate and/or the maximum data rate makes it possible to obtain an acceptable reproduction quality of the compressed video data at the receiver, since the real-time transmission allows only very short delay times; e.g., in the milliseconds range.

The maximum data rate corresponds to the total data rate in the fixed network ISDN which results from a plurality of individual data rates which are used during transmission of the video data stream via a plurality of circuit-switched connections. For the example of the two 64 kbit/s transmission paths, the total data rate is 128 kbit/s. The average data rate is characterized by the volume of data which is generated by the video coder within a defined period of time during a typical video conference. Preferably, this average data rate is determined empirically on the basis of a point-to-point video conference (i.e., little to no moving background, no particular lip movements nor gestures and facial expressions of the subscriber) and made available as a configurable parameter to the control unit CTR of the device SSU. With the use of a codec according to the ITU-T H.263 Standard and an unmoving background, the average data rate of a point-to-point video conference is, by way of example, about 10 kbit/s for the QCIF picture format and 176*144 pixels.

Although the present invention has been described with reference to specific embodiments, those of skill in the art will recognize that changes may be made thereto without departing from the spirit and scope of the invention as set forth in the hereafter appended claims.

I claim as my invention:

1. A method for real-time transmission of compressed data, the method comprising:
    receiving both useful data and filling data as a data stream with a fixed data rate via a circuit-switched connection of a first communications network, wherein said data stream includes said compressed data;
    removing the filling data contained in the data stream with the constant data rate;
    processing the remaining useful data, contained in the data stream with the constant data rate, into a format compatible with a data stream with a variable data rate via a packet-oriented connection by embedding the useful data into the transmission format of the packet-oriented connection, wherein said variable data rate corresponds to a variable transmission bandwidth available for the subscriber connection; and
    transmitting the processed data stream with a variable data rate via a packet-oriented connection of a second communications network, wherein the packet-oriented connection comprises one of General Packet Radio Service (GPRS) cells, and Asynchronous Transfer Mode (ATM) cells, communicating quality data for identifying transmission quality of the packet-oriented connection to the second communications network.

2. A method for real-time transmission of compressed data as claimed in claim 1, wherein the useful data comprises compressed video data.

3. A method for real-time transmission of compressed data as claimed in claim 1, the method further comprising:
    determining as the quality data at least one of an average data rate and a maximum data rate for the data stream with the variable data rate.

4. A method for real-time transmission of compressed data as claimed in claim 1, the method further comprising:
    using a quality factor of a transmission channel used for the data stream with the variable data rate for identifying the transmission quality.

* * * * *